(12) United States Patent
Chu et al.

(10) Patent No.: US 7,177,202 B2
(45) Date of Patent: Feb. 13, 2007

(54) METHOD FOR ACCESSING A SINGLE PORT MEMORY

(75) Inventors: Yuan-Kai Chu, Tainan County (TW); Pen-Hsin Chen, Tainan County (TW); Kuei-Hsiang Chen, Tainan County (TW); Lin-Kai Bu, Tainan County (TW)

(73) Assignee: Himax Technologies, Inc., Tainan County (TW)

( * ) Notice: Subject to any disclaimer, the term of this patent is extended or adjusted under 35 U.S.C. 154(b) by 201 days.

(21) Appl. No.: 10/711,573

(22) Filed: Sep. 25, 2004

(65) Prior Publication Data
US 2005/0281124 A1    Dec. 22, 2005

(30) Foreign Application Priority Data
Jun. 16, 2004    (TW) ................ 93117282 A

(51) Int. Cl.
*G11C 7/00* (2006.01)

(52) U.S. Cl. .................. 365/189.04; 365/230.03

(58) Field of Classification Search ........... 365/189.01
See application file for complete search history.

(56) References Cited

U.S. PATENT DOCUMENTS

| 2002/0126071 A1* | 9/2002 | Kojima et al. ............... 345/60 |
| 2004/0164322 A1* | 8/2004 | Kondo et al. ............... 257/200 |

* cited by examiner

*Primary Examiner*—Thong Q. Le
(74) *Attorney, Agent, or Firm*—Jiang Chyun IP Office

(57) ABSTRACT

A method for accessing a single port memory is provided. A single port memory is used as a line buffer and divided into a plurality of memory blocks. The line buffer data is written into or read out from these memory blocks by turns with a special sequence corresponding to the operation mode; for example, a normal mode or a PLM mode. Therefore, the line buffer data can be written into or read out from the line buffer at the same time, and the size and cost of integrated circuit can be reduced.

19 Claims, 6 Drawing Sheets

FIG. 2

|  |  | Memory block | | | | | | | |
|---|---|---|---|---|---|---|---|---|---|
|  |  | 1 | 2 | 3 | 4 | 5 | 6 | 7 | 8 |
| Time section | 1 | WF1 | | | | | | | |
| | 2 | | WF2 | | | | | | |
| | 3 | | | WF3 | | | | | |
| | 4 | | | | WF4 | | | | |
| | 5 | | | | | WB1 | | | |
| | 6 | | | | | | WB2 | | |
| | 7 | RF1 | | | | RB1 | | WB3 | |
| | 8 | | | | | | | | WB4 |
| | 9 | WF1 | RF2 | | | | RB2 | | |
| | 10 | | | | | WF2 | | | |
| | 11 | | WF3 | RF3 | | | | RB3 | |
| | 12 | | | | | | WF4 | | |
| | 13 | | | WB1 | RF4 | | | | RB4 |
| | 14 | | | | | | | WB2 | |
| | 15 | RF1 | | RB2 | WB3 | | | | |
| | 16 | | | | | | | | WB4 |
| | 17 | WF1 | | | | RF2 | | RB2 | |
| | 18 | | | WF2 | | | | | |
| | 19 | | RF3 | | RB3 | WF3 | | | |
| | 20 | | | | | | | WF4 | |
| | 21 | | WB1 | | | | RF4 | | RB4 |
| | 22 | | | | WB2 | | | | |
| | 23 | RF1 | RB1 | | | | WB3 | | |
| | 24 | | | | | | | | WB4 |
| | 1 | WF1 | | RF2 | RB2 | | | | |
| | 2 | | WF2 | | | | | | |
| | 3 | | | WF3 | | RF3 | RB3 | | |
| | 4 | | | | WF4 | | | | |
| | 5 | | | | | WB1 | | RF4 | RB4 |
| | 6 | | | | | | WB2 | | |
| | 7 | RF1 | | | | RB1 | | WB3 | |
| | 8 | | | | | | | | WB4 |

| Time section | Memory block 1 | 2 | 3 | 4 | 5 | 6 | 7 | 8 |
|---|---|---|---|---|---|---|---|---|
| 1 | WE1 | | | | WO1 | | | |
| 2 | | | | | | | | |
| 3 | | WE2 | | | | WO2 | | |
| 4 | | | | | | | | |
| 5 | | | WE3 | | | | WO3 | |
| 6 | | | | | | | | |
| 7 | RE1 | | | WE4 | | | | WO4 |
| 8 | | RE2 | | | | | | |
| 9 | WE1 | WO1 | RE3 | | | | | |
| 10 | | | | RE4 | | | | |
| 11 | | | WE2 | WO2 | RO1 | | | |
| 12 | | | | | | RO2 | | |
| 13 | | | | | WE3 | WO3 | RO3 | |
| 14 | | | | | | | | RO4 |
| 15 | RE1 | | | | | | WE4 | WO4 |
| 16 | | RE2 | | | | | | |
| 17 | WE1 | | WO1 | | RE3 | | | |
| 18 | | | | | | | RE4 | |
| 19 | | RO1 | | | WE2 | | WO2 | |
| 20 | | | | RO2 | | | | |
| 21 | | WE3 | | WO3 | | RO3 | | |
| 22 | | | | | | | | RO4 |
| 23 | RE1 | | | | | WE4 | | WO4 |
| 24 | | | | | RE2 | | | |
| 1 | WE1 | RE3 | | | WO1 | | | |
| 2 | | | | | | RE4 | | |
| 3 | | WE2 | RO1 | | | WO2 | | |
| 4 | | | | | | | RO2 | |
| 5 | | | WE3 | RO3 | | | WO3 | |
| 6 | | | | | | | | RO4 |
| 7 | | | | WE4 | | | | WO4 |
| 8 | | | | | | | | |

FIG. 6

METHOD FOR ACCESSING A SINGLE PORT MEMORY

CROSS-REFERENCE TO RELATED APPLICATION

This application claims the priority benefit of Taiwan application serial no. 93117282, filed Jun. 16, 2004.

BACKGROUND OF THE INVENTION

1. Field of the Invention

The present invention relates to a method for accessing a single port memory.

2. Description of the Related Art

In order to rearrange and provide the received pixel data based on the requirement of different operation mode, a line buffer is commonly used in the LCD timing controller to cache the line pixel data, such that the line pixel data can be accurately transmitted by the timing controller. Wherein, in order to support the read and write operations simultaneously, a dual port memory is commonly used as the line buffer. However, the dual port memory occupies large space inside the integrated circuit (IC), thus it is hard to reduce the product cost and size.

SUMMARY OF THE INVENTION

Therefore, the object of the present invention is to provide a method for accessing a single port memory. In this method, a single port memory is used as the line buffer in a display control circuitry or in a liquid crystal display system to fulfill the requirement of simultaneously reading and writing the line buffer.

In order to achieve the above and other objects, the present invention provides a method for accessing a single port memory, which can safely and simultaneously access the line data operated in a normal mode. The method comprises the following steps: dividing a single port line buffer into N memory blocks, wherein N is an integer; receiving the line data, and sequentially writing the received line data into the divided N memory blocks; after writing more than N/2+1 memory blocks, reading out the line data from the memory blocks based on the requirement of the normal mode operation; and sequentially writing a next line data into the memory block where the stored line data has been completely read out.

Wherein, the single port line buffer may be divided into 8 memory blocks.

Alternatively, the reading of the line data from the memory blocks may start after the writing of N/2+2 memory blocks is completed based on the requirement of the normal mode operation.

The present invention further provides a method for accessing a single port memory, which can safely and simultaneously access the line data which is operated in PLM mode. The method comprises the following steps: dividing a single port line buffer into N memory blocks, wherein N is an integer; receiving the line data, and writing the even data and odd data of the line data into the divided N memory blocks with a sequence of $1^{st}$ memory block and $(N/2+1)^{th}$ memory block, $2^{nd}$ memory block and $(N/2+2)^{th}$ memory block, . . . , etc, respectively; after writing more than N/2+1 memory blocks, reading out the line data from the memory blocks based on the requirement of the PLM mode operation; and sequentially writing the even data and odd data of next line data into the memory block where the stored line data has been completely read out, respectively.

Wherein, the single port line buffer may be divided into 8 memory blocks.

Alternatively, the reading of the line data from the memory blocks may start after the writing of N/2+2 memory blocks is completed based on the requirement of the PLM mode operation.

In summary, in the method for accessing the single port memory in the present invention, the single port line buffer is divided into N memory blocks, and different memory blocks in the line buffer are sequentially read out or written into based on the requirement of the normal mode or PLM mode operation. Therefore, the single port memory can be used in the display control circuitry or in the liquid crystal display system as the line buffer, such that the requirement of simultaneously reading and writing the line buffer is achieved.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 2 schematically shows a timing diagram for illustrating a line buffer writing completion operation under a normal mode.

FIG. 3 schematically shows a timing diagram for illustrating a line buffer write/read operation under a normal mode.

FIG. 5 schematically shows a timing diagram for illustrating a line buffer writing completion operation under a PLM mode.

FIG. 6 schematically shows a timing diagram for illustrating a line buffer write/read operation under a PLM mode.

DESCRIPTION OF EMBODIMENTS

For a clear explanation and better understanding of the method for accessing the single port memory in the present invention, a display control circuitry supporting UXGA is exemplified hereinafter. Each UXGA line has 1600 pixels, thus the line buffer in the display control circuitry can store a line data of up to 1600 pixels, wherein the line buffer is a single port memory. In addition, assuming that all memory blocks in the line buffer can be accessed with the same speed, the example that the line buffer is divided into 8 memory blocks, wherein each memory block stores a line data of 200 pixels, is used hereinafter to describe how to safely access different memory block in the line buffer in the right sequence. It will be apparent to those skilled in the art that the line buffer may be divided into different number of memory blocks based on different requirement.

Figure 1:
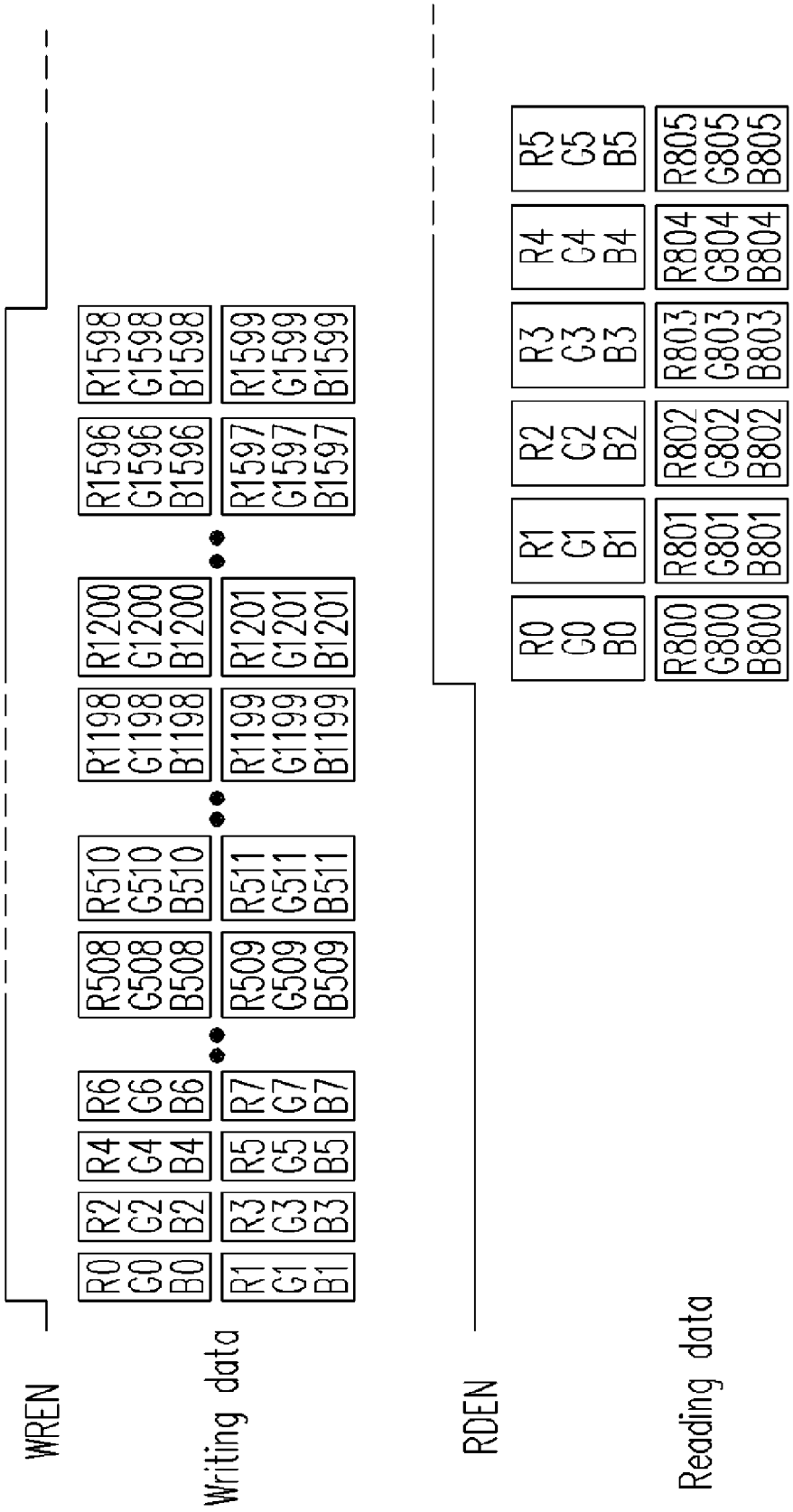
FIG. 1 schematically shows a timing diagram for illustrating a line buffer access operation under a normal mode.

FIG. 1 schematically shows a timing diagram for illustrating a line buffer access operation under a normal mode. In FIG. 1, R0, G0, B0 represents the Red (R), Green (G), Blue (B) color data of the pixel 0 in the line, respectively; R1, G1, B1 represents the Red (R), Green (G), Blue (B) color data of the pixel 1 in the line, respectively; . . . , etc.

Figure 2:
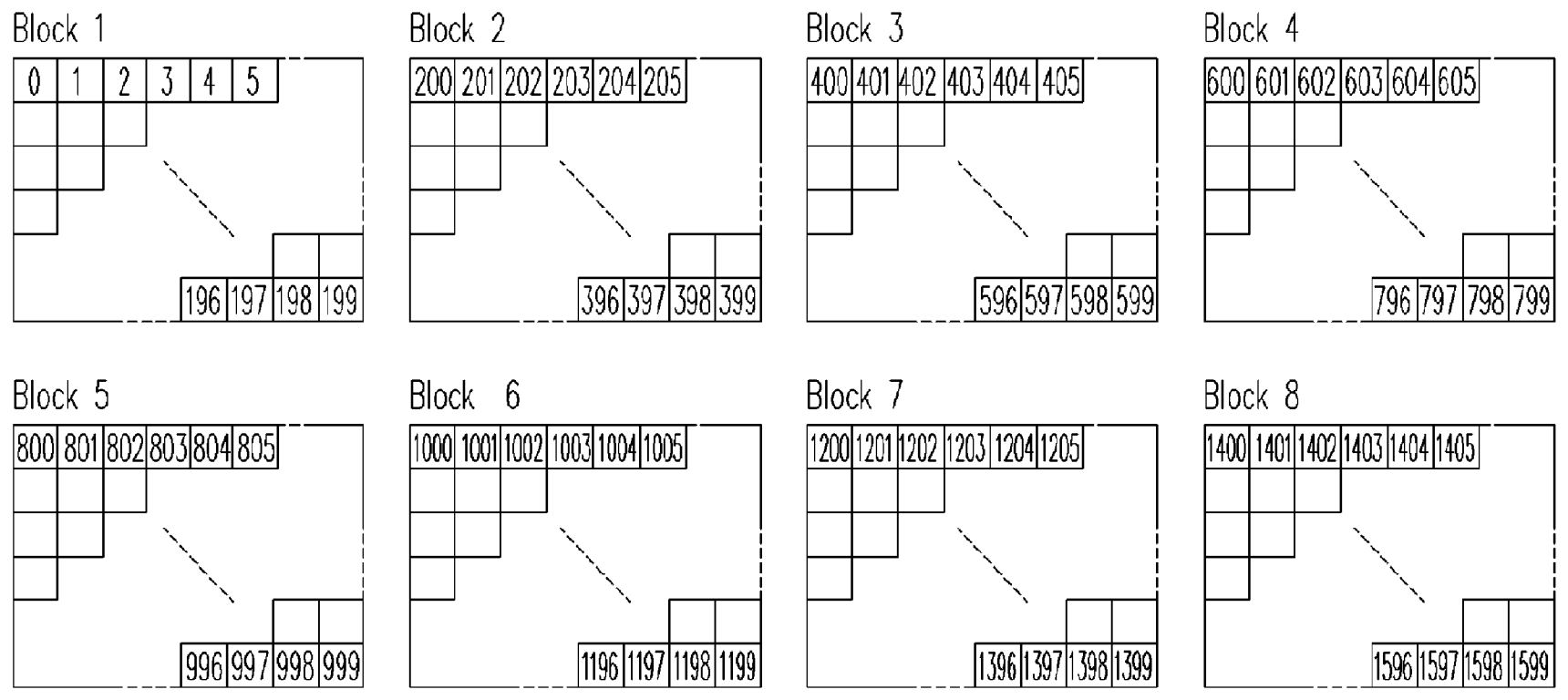

As shown in FIG. 1, under the normal mode operation, when a writing signal WREN is enabled, the line data R0, G0, B0, R1, G1, B1, . . . , R1599, G1599, B1599, are sequentially written into the line buffer. Of course, the example shown above refers to writing a data of two pixels into the line buffer simultaneously. Then, when a reading signal RDEN is enabled, a line data of each pixel from pixels 0~799 and pixels 800~1599 is sequentially read. Therefore, after the line data is received by the display control circuitry, the display control circuitry first sequentially writes the received line data into the divided 8 memory blocks, and the process of writing completion is shown in FIG. 2, wherein the numbers are used to represent the pixel id of the stored line data. During the reading operation, in order to fulfill the requirement of sequentially reading the line data of each pixel from pixels 0~799 and pixels 800~1599, each pixel data from block 1 and block 5 has to be sequentially read first, and each pixel data from block 2 and block 6 has to be sequentially read after the reading of the memory blocks mentioned above is completed, . . . , etc.

Since the line buffer used here is a single port memory, which cannot perform the read and write operations on the same memory block simultaneously, the read operation is only started after the writing of the $5^{th}$ memory block is completed. In the present embodiment, the reading of the line data from the memory block is started after the writing of the $6^{th}$ memory block is completed based on the requirement of the normal mode operation. After the reading operation is started, since the next line data can overwrite the memory block only after the memory block has been completely read out, the next line data is then sequentially written into the memory block where the stored line data has been completely read out, wherein the sequence of reading and writing of the first several lines is shown in FIG. 3, and others follow the same order.

As shown in FIG. 3, the numbers '1' to '8' on X-axis are the memory block id, and the numbers '1' to '24' on Y-axis are the time section id of the time required for reading and writing one memory block. According to the access sequence mentioned above, a full read and write cycle is completed after running 24 time sections, thus the time section id is reset to '1' after number '24'. Wherein, Wxx and Rxx represent the data block of the writing and reading id xx, respectively, and F1~F4 and B1~B4 represent the line data block of the pixels 0~199, 200~399, 400~599, 600~799, and pixels 800~999, 1000~1199, 1200~1399, 1400~1599, respectively. As shown in FIG. 3, since in the reading method of the normal mode operation, each data of one memory block, for example, the data block where F1 is stored and the data block where B1 is stored, are read simultaneously by turns. Therefore, the reading operation is performed during the $7^{th}$ and $8^{th}$ time sections, and the line data F1 and F2 of next line are sequentially written into the $1^{st}$ and $5^{th}$ memory blocks where the stored line data has been completely read out during the $9^{th}$ and $10^{th}$ time sections.

Therefore, with the method for accessing the single port memory in the present invention, different memory blocks in the single port line buffer are accessed by turns based on the requirement of the normal mode operation. Accordingly, the single port memory can be used as the line buffer in the liquid crystal display panel, so as to fulfill the requirement of simultaneously reading and writing the line buffer without any clashing.

Figure 4:
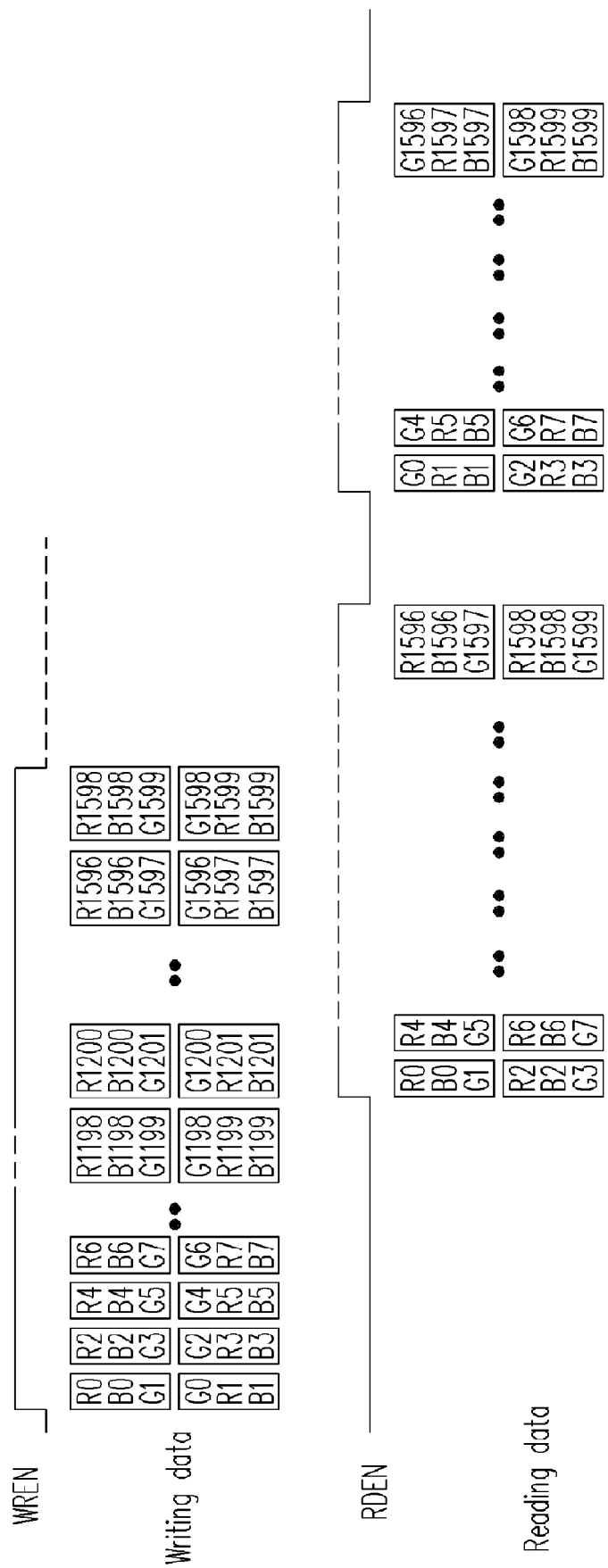
FIG. 4 schematically shows a timing diagram for illustrating a line buffer access operation under a PLM mode.

FIG. 4 schematically shows a timing diagram for illustrating a line buffer access operation under a PLM mode. As shown in FIG. 4, R0, G0, B0 represents the Red (R), Green (G), Blue (B) color data of the pixel 0 in the line, respectively; R1, G1, B1 represents the Red (R), Green (G), Blue (B) color data of the pixel 1 in the line, respectively; . . . , etc.

Figure 5:
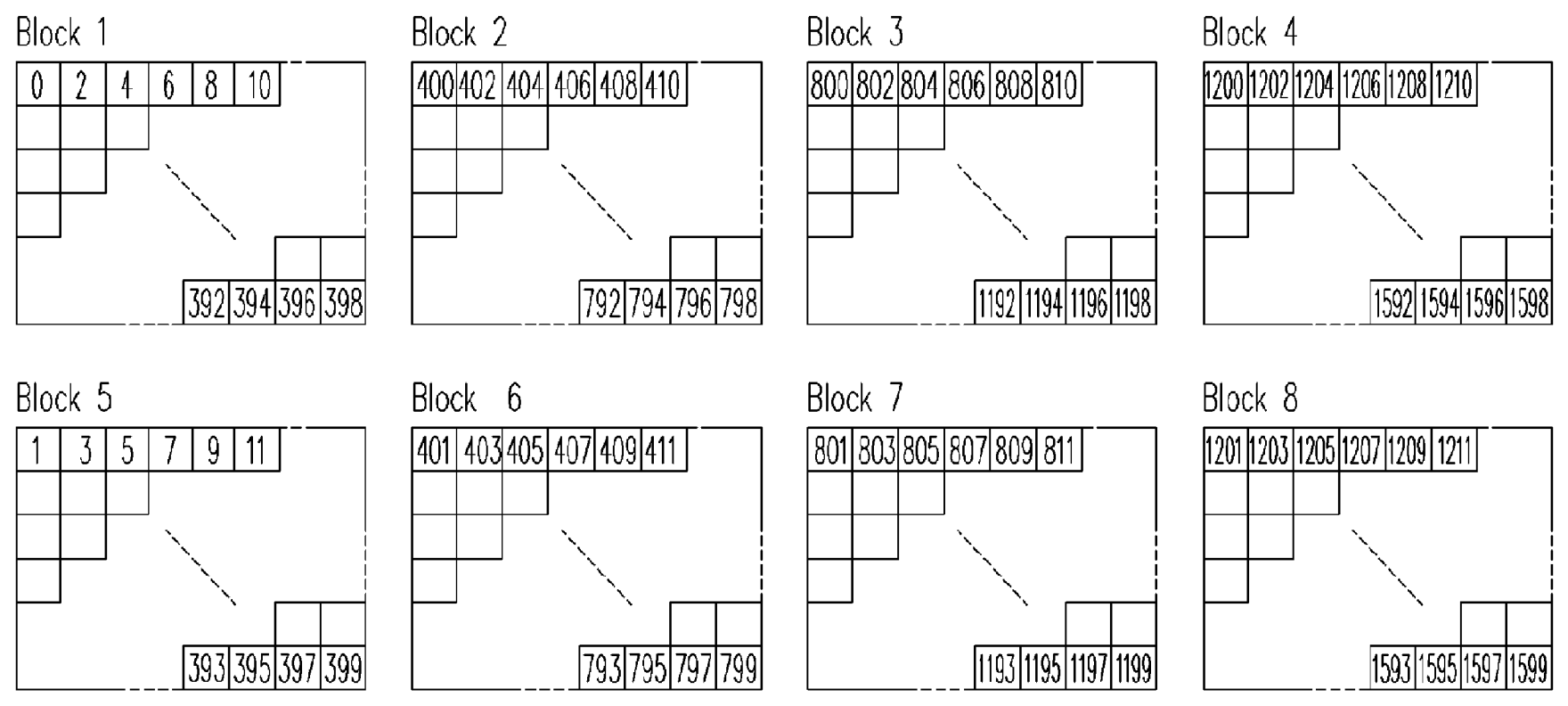

As shown in FIG. 4, under the PLM mode operation, when a writing signal WREN is enabled, the line data R0, B0, G1, G0, R1, B1, . . . , G1598, R1599, B1599, are sequentially written into the line buffer. Of course, in order to fulfill the requirement of the PLM mode operation, the example shown above refers to writing an even number of even data R0, B0, G1, which are arranged in a sequence starting from 0 among R0, G0, B0, R1, G1, B1, and the odd number of odd data G0, R1, B1, which are arranged in a sequence starting from 0 among R0, G0, B0, R1, G1, B1 into the memory blocks, respectively. The top and bottom rows of the written data shown in FIG. 4 are sequentially written into the divided 8 memory blocks in a sequence of $1^{st}$ memory block and $5^{th}$ memory block, $2^{nd}$ memory block and $6^{th}$ memory block, . . . , etc, respectively. Afterwards, when the reading signal RDEN is enabled, the line data stored in the memory block 1, memory block 2, memory block 3, are sequentially read out. Therefore, after the line data is received by the display control circuitry, the display control circuitry first writes the even data and odd data of the line data into the blocks 1~4 and blocks 5~8 of the divided 8 memory blocks in a sequence shown in FIG. 4, respectively. The process of writing completion is shown in FIG. 5, wherein the numbers represent the sequence number of the even data and odd data. During the reading operation, the line data in memory block 1, memory block 2, memory block 3 are sequentially read out, such that the even data is read first, and the odd data is read later, so as to fulfill the requirement of the PLM mode operation shown in FIG. 4.

Of course, since the line buffer used here is a single port memory, which cannot perform the read and write operations on the same memory block simultaneously, the read operation is only started after the writing of 5 memory blocks is completed. In the present embodiment, the reading of the line data from the memory block is started after the writing of 6 memory blocks is completed based on the requirement of the PLM mode operation. After the reading operation is started, since the next line data can overwrite the memory block only after the memory block has been completely read out, the even data and odd data of the next line data are then sequentially written into the memory block where the stored line data has been completely read out, wherein the sequence of reading and writing of the first several lines is shown in FIG. 6, and others follow the same order.

As shown in FIG. 6, the numbers '1' to '8' on X-axis are the memory block id, and the numbers '1' to '24' on Y-axis are the time section id of the time required for reading and writing one memory block. In the above description, a full read and write cycle is completed after running 24 time sections, thus the time section id is reset to '1' after number '24'. Wherein, Wxx and Rxx represent the data block of the writing and reading id xx, respectively, and E1~E4 and O1~O4 represent the data block of the even data and odd data, respectively. As shown in FIG. 6, since in the writing method of the PLM mode operation, each data of one memory block, for example, the data block where the even data E1 is stored and the data block where the odd data O1 is stored, are written into the memory block, respectively. Therefore, the writing operation is performed during the $1^{st}$ and $2^{nd}$ time sections, and the line data E1 and O1 of the next line are sequentially written into the $1^{st}$ and $2^{nd}$ memory blocks where the stored line data has been completely read out during the 9$^{th}$ and 10$^{th}$ time sections.

Therefore, with the method for accessing the single port memory in the present invention, different memory blocks in the single port line buffer are accessed by turns based on the requirement of the PLM mode operation. Accordingly, the single port memory can be used as the line buffer in the display control circuitry or in the liquid crystal display system, so as to fulfill the requirement of simultaneously reading and writing the line buffer without any clashing.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for accessing memory, comprising the steps of:
   providing a memory having N memory blocks, wherein N is an positive integer;
   receiving a plurality of line data, and sequentially writing the line data into the memory blocks, and
   after writing more than x memory blocks, starting to read the line data stored in at least one of the written memory blocks, wherein x is a least integer not less than N/2+1.

2. The method for accessing memory of claim 1, wherein the memory is a single port memory.

3. The method for accessing memory of claim 2, wherein the reading step is started after the writing of memory blocks is completed, wherein y is a least integer not less than N/2+2.

4. The method for accessing memory of claim 2, wherein the reading step firstly reads the from the 1$^{st}$ memory block and the x$^{th}$ memory block.

5. The method for accessing memory of claim 1, wherein the storage capacity of die memory is the same as the size of the plurality of the line data.

6. The method for accessing memory of claim 5, wherein the memory is a single port memory.

7. The method for accessing memory of claim 1, wherein the writing further comprises the steps of:
   dividing the line data into a plurality of even data and a plurality of odd data according to a sequence of the line data; and
   writing the even data and odd data into the N memory blocks, respectively, wherein the memory block for writing the even data is different from the memory block for writing the odd data.

8. The method for accessing memory of claim 7, wherein the storage capacity of the memory is the same as the size of the plurality of the line data.

9. The method for accessing memory of claim 7, wherein the memory is a single port memory.

10. The method for accessing memory of claim 7, wherein the reading step is started after the writing of memory blocks is completed, wherein y is a least integer not less than N/2+2.

11. The method for accessing memory of claim 8, wherein the reading step is started after the writing of y memory blocks is completed, wherein y is a least integer not less than N/2+2.

12. The method for accessing memory of claim 8, wherein the memory is a single port memory.

13. The method of claim 1, wherein the plurality of line data having pixel data (0)—pixel data (M−1) constituting a line, the pixel data (0)—the pixel data ([M/2]) are even data of the line data and the pixel data ([M/2]+1) the pixel data (M-l) are odd data of the line data, wherein [M/2] is the least integer not less than M/2;
   wherein the size of the memory is equal to the size of the plurality of line data.

14. The method claim 13, wherein the reading step reads both the k-th memory block and the [N/2+k]th memory block such that the even data and the odd data for one pixel are read at the same time for output, wherein k is an integer less than N/2.

15. The method of claim 14, wherein after the reading step finished reading the k-th memory block and the [N/2+k]th memory block, the k-th memory block and the [N/2+k]th memory block are enabled for writing line data of a next line.

16. A method for accessing a memory having N memory blocks, wherein N is a positive integer, the method comprising the steps of:
   receiving and writing line data, having pixel data (0)—pixel data (M−[1]), into the i-th memory block and the [N/2+i]th memory block alternatively, wherein the pixel data (k) being even data if k is even else the pixel data (k) being odd data, i is an positive integer less than N/2, [N/2+i] is the least integer not less than N/2+i, M is an positive integer, k is a positive integer less than M; and
   reading the pixel data from the memory after [N/2+1] memory blocks are written, wherein [N/2+1] is the least integer not less than N/2+1.

17. The method of claim 16, wherein the size of the memory is equal to the size of the plurality of pixel data.

18. The method claim 17, wherein the reading step sequentially reads from the memory blocks such that the even data of the line data are read first and then odd data of the line data are read.

19. The method of claim 16, wherein after the reading step finished reading the j-th memory block, the j-th memory block is enabled for writing line data of a next line, wherein j is an positive integer less than M.

* * * * *